United States Patent
Kwon et al.

(10) Patent No.: US 7,884,875 B2
(45) Date of Patent: Feb. 8, 2011

(54) CAMERA MODULE HAVING LOWER CONNECTION PORTIONS DEFINING A CHIP REGION AND ENGAGING UPPER CONNECTION PORTIONS OF A LENS STRUCTURE AND METHOD OF FABRICATING THE SAME

(75) Inventors: Yong-Chai Kwon, Gyeonggi-do (KR); Dong-Ho Lee, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 584 days.

(21) Appl. No.: 11/866,940

(22) Filed: Oct. 3, 2007

(65) Prior Publication Data

US 2008/0087974 A1 Apr. 17, 2008

(30) Foreign Application Priority Data

Oct. 3, 2006 (KR) .................. 10-2006-0097471

(51) Int. Cl.
*H04N 5/225* (2006.01)
*H01L 21/00* (2006.01)
(52) U.S. Cl. ........................ 348/340; 438/64
(58) Field of Classification Search ........... 348/340; 438/64, 68, 75
See application file for complete search history.

(56) References Cited

U.S. PATENT DOCUMENTS

2004/0212717 A1* 10/2004 Minamio et al. .......... 348/340
2005/0219398 A1* 10/2005 Sato et al. ................. 348/340
2005/0237418 A1* 10/2005 Sakamoto ................. 348/340
2006/0151847 A1* 7/2006 Kwon et al. .............. 257/433
2006/0152615 A1* 7/2006 Kwon et al. .............. 348/340

FOREIGN PATENT DOCUMENTS

| JP | 2001-85655 | 3/2001 |
| JP | 2002-185826 | 6/2002 |
| JP | 2003-51973 | 2/2003 |
| JP | 2004-229167 | 8/2004 |
| JP | 2005-328559 | 11/2005 |
| KR | 10-2006-0020279 | 3/2006 |

OTHER PUBLICATIONS

English language abstract of Japanese Publication No. 2001-85655.
English language abstract of Japanese Publication No. 2002-185826.
English language abstract of Japanese Publication No. 2004-229167.

* cited by examiner

*Primary Examiner*—Kelly L Jerabek
(74) *Attorney, Agent, or Firm*—Myers Bigel Sibley & Sajovec, PA

(57) ABSTRACT

Provided are a camera module and a method of fabricating the same. The method includes preparing a lens structure including upper connection portions. Lower connection portions are formed in a predetermined region of a substrate. The lower connection portions define a chip region and fit in the upper connection portions, respectively. An image sensor chip is located on the bottom surface of the chip region. The lens structure is adhered to the substrate using the upper and lower connection portions.

25 Claims, 10 Drawing Sheets

CAMERA MODULE HAVING LOWER CONNECTION PORTIONS DEFINING A CHIP REGION AND ENGAGING UPPER CONNECTION PORTIONS OF A LENS STRUCTURE AND METHOD OF FABRICATING THE SAME

CROSS-REFERENCE TO RELATED APPLICATION

This application claims priority under 35 USC §119 to Korean Patent Application No. 10-2006-0097471, filed on Oct. 3, 2006, the disclosure of which is hereby incorporated herein by reference in its entirety.

BACKGROUND

1. Technical Field

The present invention relates to a camera module and a method of fabricating the same.

2. Description of the Related Art

In recent years, portable phones including digital cameras are becoming widely popular. A camera module used for most portable phones includes an optical lens and an image sensor that converts incident light passing through the optical lens into an electrical signal. The electrical signal converted by the image sensor is transmitted to an image signal processing unit (ISP) and output as an image signal.

More specifically, incident light passes through the optical lens, a micro-lens and an RGB filter and is incident on a photodiode. The photodiode generates charges corresponding to the intensity of the incident light, converts the charges into an electrical signal, and transmits the electrical signal to the ISP. In this case, the image sensor is electrically connected to a substrate, which is connected to an external image processor, using bonding wires or metal bumps.

The camera module includes, in general, an image sensor chip, a substrate on which the image sensor chip is disposed, a barrel disposed on the substrate, and a lens and a near infrared (NIR) filter inserted into the barrel. According to the conventional art, since the foregoing components are fabricated separately, it is difficult to miniaturize the components. This technical restriction leads to the increase of the fabrication costs. Furthermore, the image sensor chip is typically assembled while being exposed to atmosphere, thus causing a drop in yield due to particle contamination from the atmosphere.

In order to overcome the foregoing drawbacks, it has been recently proposed that a lens structure could be formed on a transparent wafer using polymers that can be hardened by exposure to ultraviolet (UV) light. The resultant lens structure could be bonded to a substrate having an image sensor chip using spacers formed of low-temperature polymers or metallic materials, and divided into respective camera modules using a dicing process. In this method, the lens structure can be easily fabricated. However, even if the bonding process is performed at a low temperature, polymers may be deformed at the process temperature, thus resulting in the deformation of the lens structure. Since the deformation of the lens structure may bring about the deformation of an image, it is necessary to develop a new technique that can reduce the thermal budget of the bonding process.

Furthermore, the dicing process includes mechanically cutting the spacers. However, due to the spacers having a high hardness property, technical problems, such as chipping and cracks, may be caused during the mechanical cutting process. The present invention addresses these and other disadvantages of the conventional art.

SUMMARY

The present invention provides a method of fabricating a camera module that can reduce the thermal budget of a bonding process. Also, the present invention provides a method of fabricating a camera module without causing chipping or cracks. Furthermore, the present invention provides a camera module that is fabricated using a low-thermal-budget bonding process and without causing chipping or cracks.

According to an aspect of the present invention, there is provided a method of fabricating a camera module in which a lens structure is mechanically combined with a substrate. The method includes preparing the lens structure having upper connection portions. Lower connection portions are formed in a predetermined region of the substrate. The lower connection portions define a chip region and fit in the upper connection portions, respectively. An image sensor chip is located on the chip region. The lens structure is adhered to the substrate using the upper and lower connection portions.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
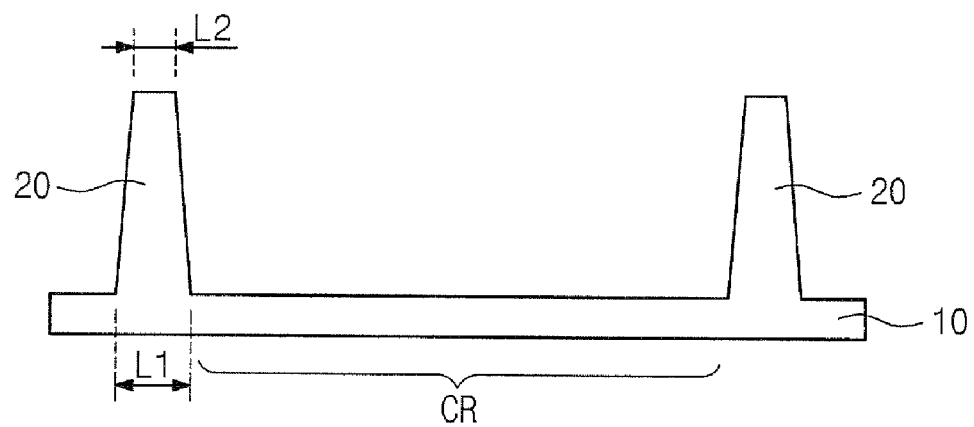
FIGS. 1 through 5 are cross-sectional views illustrating a method of fabricating a camera module according to an embodiment of the present invention.

Reference will now be made in detail to the preferred embodiments of the present invention, examples of which are illustrated in the accompanying drawings. However, the present invention is not limited to the embodiments illustrated hereinafter, and the embodiments herein are rather introduced to provide easy and complete understanding of the scope and spirit of the present invention.

It will also be understood that when a layer is referred to as being "on" another layer or substrate, it can be directly on the other layer or substrate, or intervening layers may also be present. In the drawings, the thicknesses of layers and regions are exaggerated for clarity. It will be understood that although the terms first and second are used herein to describe various regions, layers and/or sections the invention should not be limited by these terms. These terms are only used to distinguish one region, layer or section from another region, layer or section. Thus, for example, a first layer discussed below could be termed a second layer without departing from the teachings of the present invention. Each embodiment described and illustrated herein includes complementary embodiments thereof.

Figure 7:
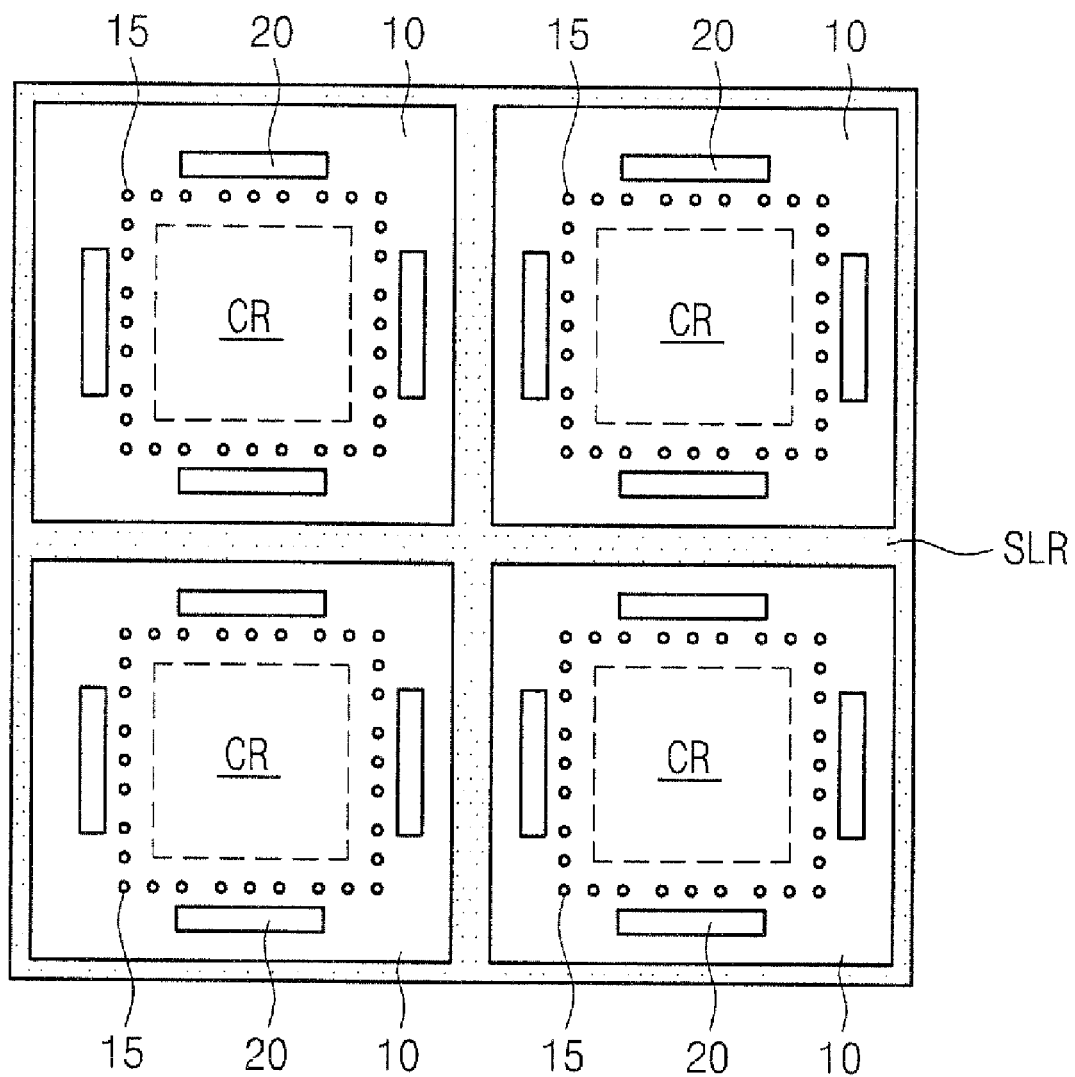
FIGS. 7 and 8 are plan views of a substrate having a lower connection portion according to an embodiment of the present invention.
Figure 8:
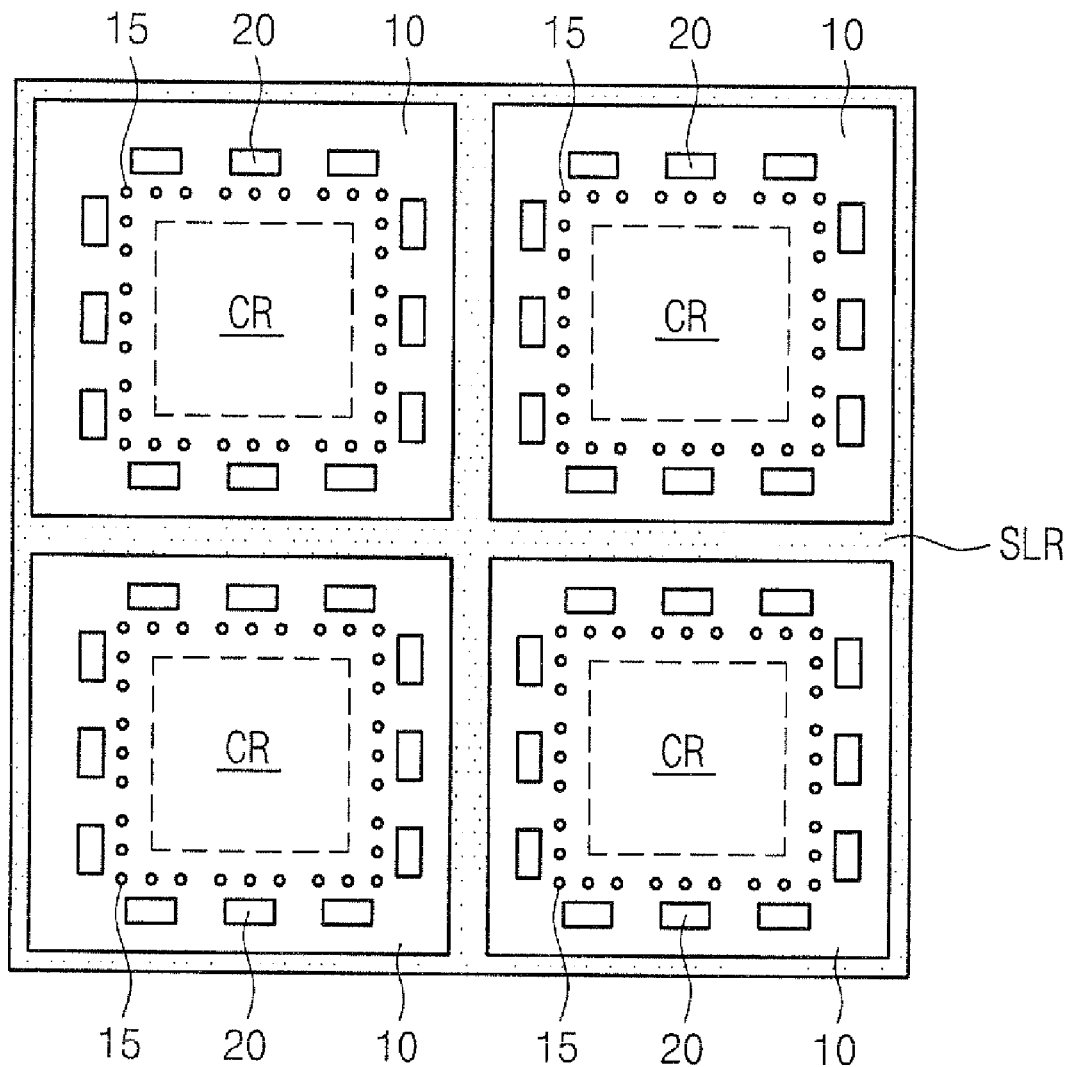

FIGS. 1 through 5 are cross-sectional views illustrating a method of fabricating a camera module according to an embodiment of the present invention, and FIGS. 7 and 8 are plan views of a substrate having a lower connection portion according to an embodiment of the present invention.

Referring to FIGS. 1, 7 and 8, a substrate 10 is prepared. The substrate 10 may be formed of at least one selected from the group consisting of silicon, glass, a plastic, and a metal. Also, an interconnection structure for connecting to an image sensor chip may be formed in the substrate 10.

The substrate 10 may be patterned, thereby forming lower connection portions 20 to define a chip region CR. The formation of the lower connection portions 20 includes forming a mask pattern (not shown) exposing the chip region CR on a region where the lower connection portions 20 will be formed and etching the substrate 10 using the mask pattern as an etch mask. The mask pattern may be a photoresist pattern formed using a photolithographic process. The etching of the substrate 10 may be performed using a dry etching process or a wet etching process.

According to an embodiment of the present invention, each of the lower connection portions 20 may have a protruding pillar shape. For example, as illustrated in FIGS. 1 and 7 through 10, each of the lower connection portions 20 may have a rectangular cross-section and protrude from the substrate 10 disposed around the chip region CR. In this case, the cross-sectional area of each of the lower connection portions 20 becomes smaller near the top of each of the lower connection portions 20 than near the bottom thereof. In other words, the lower connection portions 20 have a tapered sidewall structure. For example, as illustrated in FIG. 1, a bottom width L1 of the lower connection portion 20 may be greater than a top width L2 thereof.

Also, the dimensions and arrangement of the lower connection portions 20 may be variously changed as illustrated in FIGS. 7 and 8. That is, a single lower connection portion 20 may be formed along each of four sides of the chip region CR as illustrated in FIG. 7. Alternatively, a plurality of lower connection portions 20 may be formed along each of four sides of the chip region CR as illustrated in FIG. 8. As mentioned above, the dimensions and arrangement of the lower connection portions 20 according to the present invention can be variously changed and are not restricted by the embodiments shown in FIGS. 7 and 8.

Figure 2:
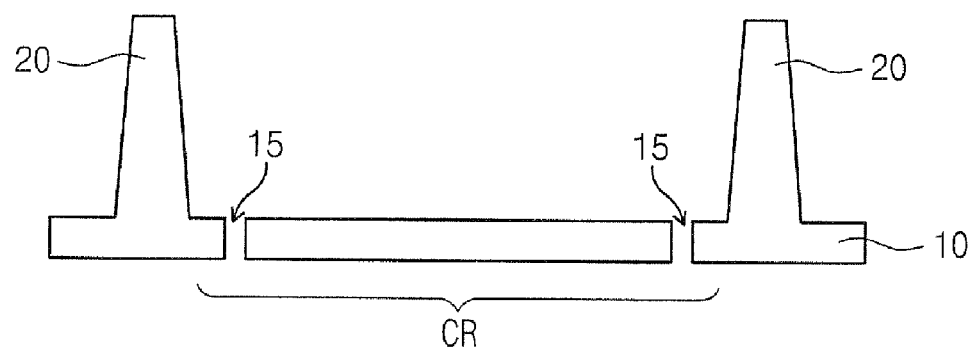

Referring to FIG. 2, the substrate 10 may be patterned to form through via holes 15 through the bottom surface of the chip region CR. The formation of the through via holes 15 may be performed using one of a laser drilling technique and a reactive ion etching (RIE) technique. The through via holes 15 are formed in an outer portion of the chip region CR.

Figure 3:
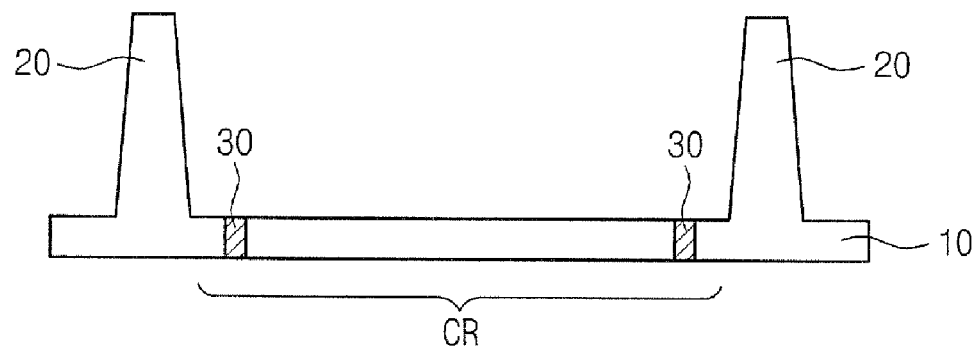

Referring to FIG. 3, through plugs 30 are formed to fill the through via holes 15. The through plugs 30 serve as an electrical connection path between an external electronic device and an image sensor chip that will be formed later.

Figure 6:
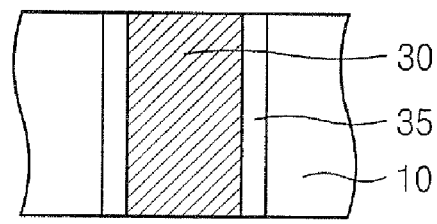
FIG. 6 is a cross-sectional view of a through plug according to an embodiment of the present invention.

According to the present invention, the through plugs 30 may be formed of at least one metal material. In an embodiment of the present invention, when the substrate 10 is formed of silicon or a conductive material, an insulating layer 35 may be formed between the through plugs 30 and the substrate 10 as illustrated in FIG. 6, so that the through holes 30 can be electrically insulated from the substrate 10.

Figure 4:
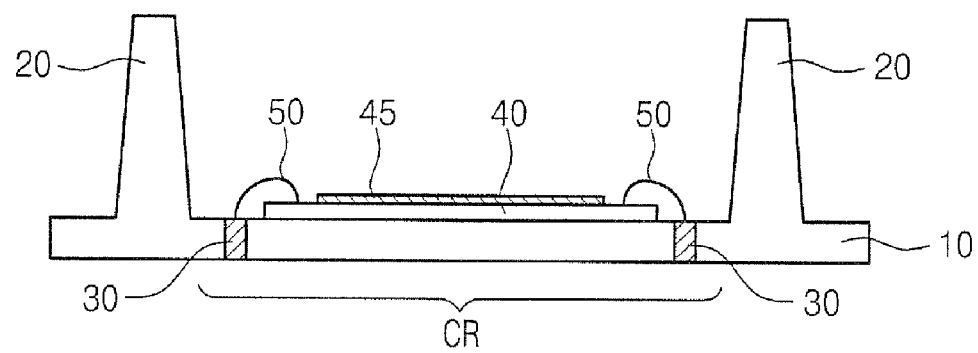

Referring to FIG. 4, an image sensor chip 40 having a micro-lens structure 45 is attached to the chip region CR. The image sensor chip 40 includes output pads (not shown), which are electrically connected to image sensor arrays (not shown) disposed under the micro-lens structure 45. In the present embodiment, the output pads are arranged on an outer portion of the image sensor chip 40.

In an embodiment of the present invention, an adhesive layer may be further interposed between the image sensor chip 40 and the substrate 10 to ensure reliable adhesion of the image sensor chip 40 to the substrate 10. An adhesion layer 70 (refer to FIG. 13), which will be formed later to fix the substrate 10 and a lens structure, may be used to adhere the image sensor chip 40 to the substrate 10.

Thereafter, bonding wires 50 are formed to electrically connect the output pads of the image sensor chip 40 with the through plugs 30. The bonding wires 50 may be formed using an ordinary wire bonding process. For example, the bonding wires 50 may be formed of gold (Au).

Figure 5:
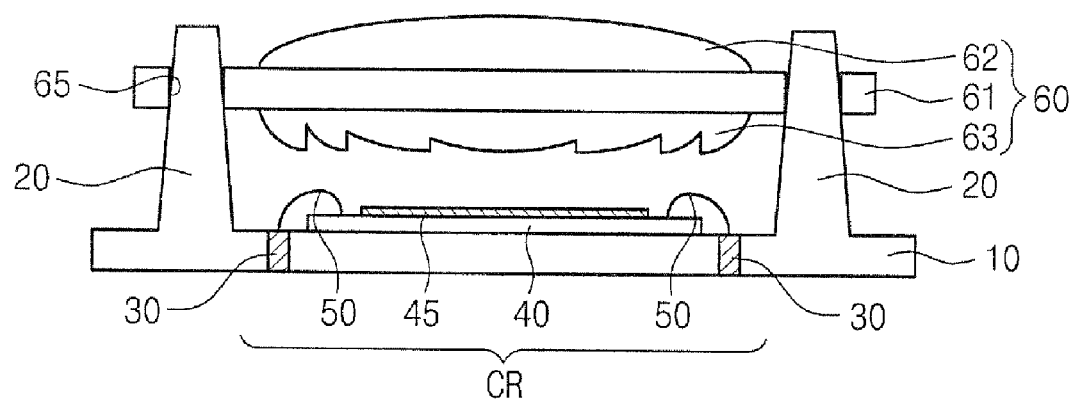
Figure 9:
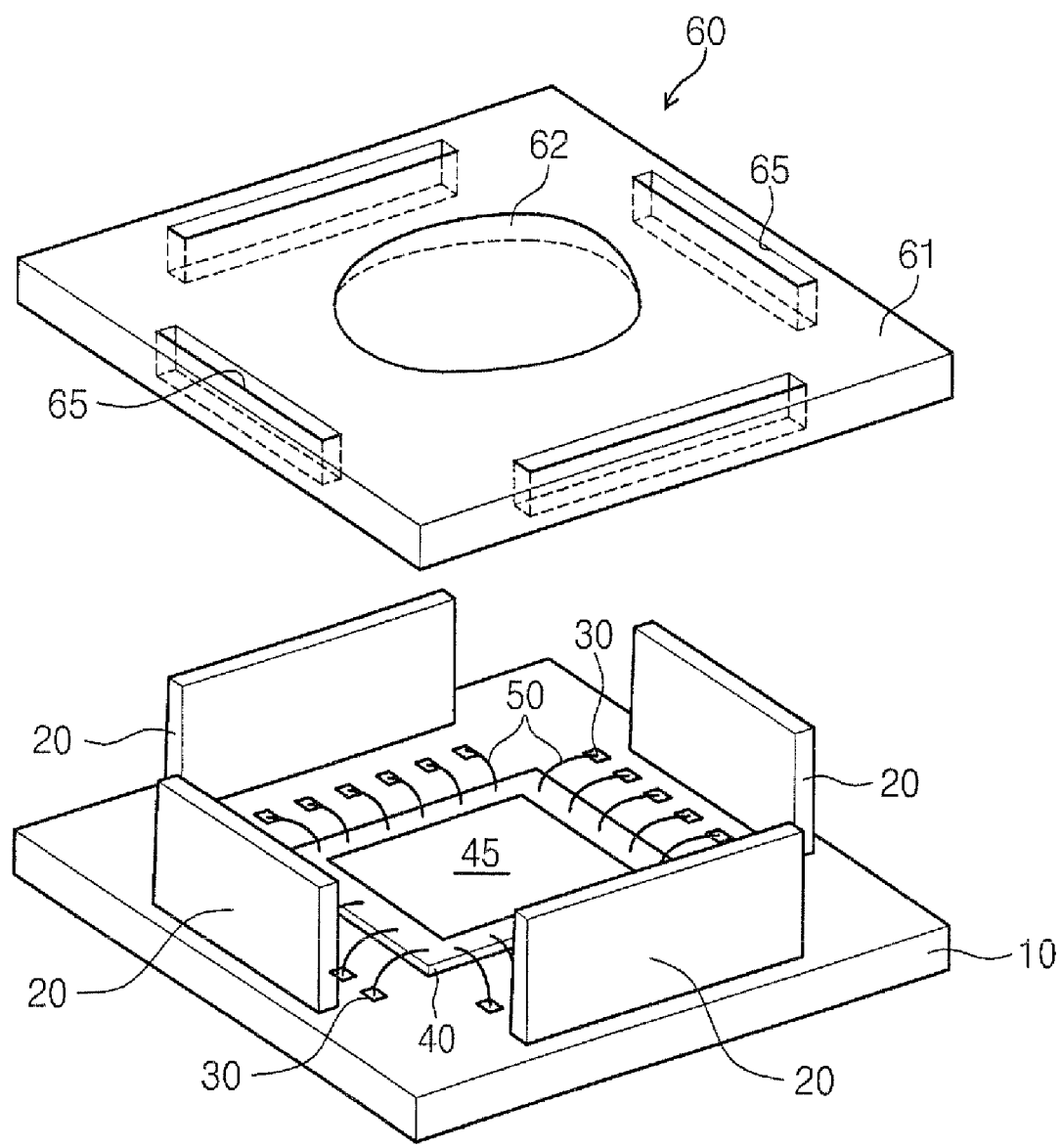
FIG. 9 is a perspective view illustrating a method of combining a camera module according to an embodiment of the present invention.
Figure 10:
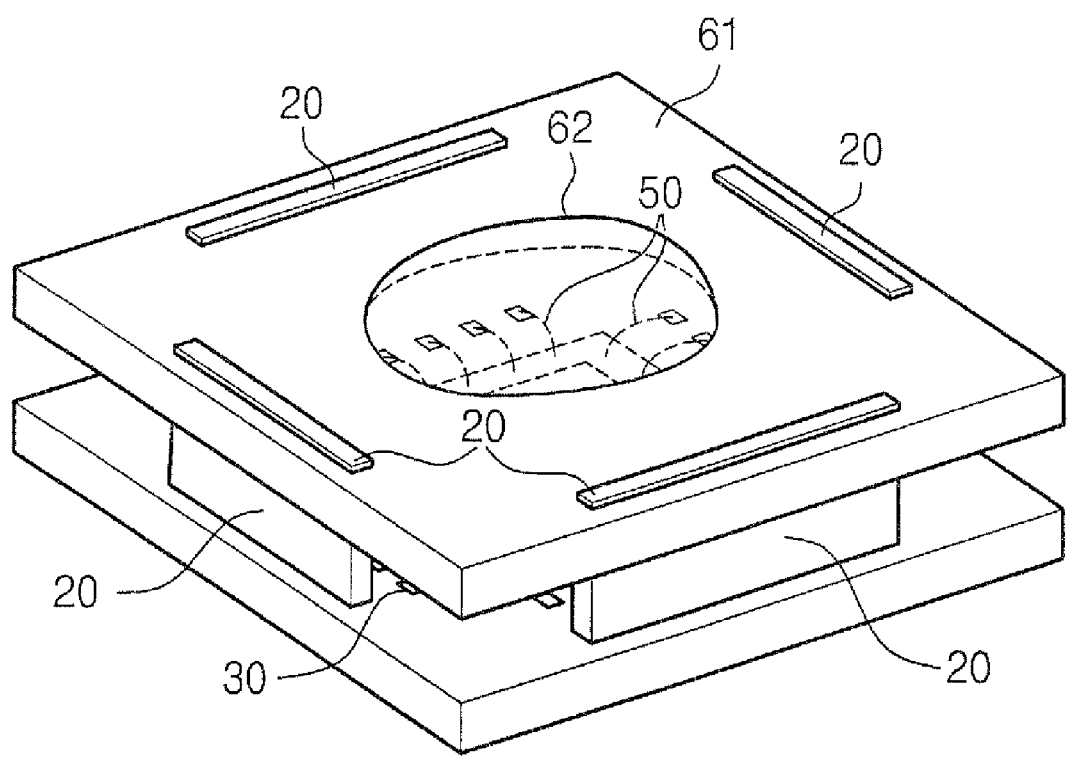
FIG. 10 is a perspective view of a camera module according to an embodiment of the present invention.

Referring to FIGS. 5, 9 and 10, a lens structure 60 is combined with the substrate 10 to which the image sensor chip 40 is attached. The lens structure 60 may include convex lenses 62 and 63, which are formed on a transparent wafer (e.g., a glass substrate) 61 to focus external light on the micro-lens structure 45, and a near infrared (NIR) filter, which cuts off NIR light. In an embodiment of the present invention, the convex lenses 62 and 63 may be formed on the glass substrate 61, and the NIR filter may be formed in, on, or under the glass substrate 61. As described in Background of the Invention, the convex lenses 62 and 63 may be formed of a polymer that can be hardened by exposure to ultraviolet (UV) light.

Upper connection portions 65 are formed in the transparent wafer 61 such that the lower connection portions 20 fit in the upper connection portions 65 to combine the image sensor chip 40 with the lens structure 60. In an embodiment of the present invention, as illustrated in FIGS. 7 through 9, the upper connection portions 65 may be grooves in which the lower connection portions 20 are inserted. In this case, the width and length of each of the upper connection portions 65 may be respectively greater than the width and length of the top surface of the corresponding lower connection portions 20 and smaller than the width and length of the bottom surface of the corresponding lower connection portions 20. Consequently, the lens structure 60, which is inserted into the lower connection portions 20 of the substrate 10, can be spaced apart from the top surface of the image sensor chip 40.

As a result, a vertical position of the lower connection portion 20 having substantially the same width as the upper connection portion 65 determines an interval between the lens structure 60 and the image sensor chip 40. According to the present invention, the interval between the lens structure 60 and the image sensor chip 40 is selected to satisfy a required focal length of the lens structure 60. Therefore, the patterning of the substrate 10 as described with reference to FIG. 1 is performed such that an inclination angle of the sidewall of the lower connection portion 20 and the dimensions of the top surface of the lower connection portion 20 can meet the above-described technical requirement.

Since the lens structure 60 is mechanically inserted in the lower connection portion 20 and fixed on the substrate 10, thermal damage caused by a conventional bonding process can be prevented according to the present invention. FIG. 10 is a perspective view of a camera module according to an embodiment of the present invention, which is fabricated using the above-described method.

Thereafter, the substrate 10 to which the lens structure 60 and the image sensor chip 40 are attached is sawed using the dicing process and divided into individual camera modules. A region along which the substrate 10 is sawed during the dicing process corresponds to a scribe lane region (refer to SLR in FIG. 7) disposed between the individual camera modules. According to the present invention, the lower connection portion 20 and the upper connection portion 65 are not included in the scribe lane region SLR. Therefore, conventional problems, such as chipping and cracks, can be alleviated.

Figure 11:
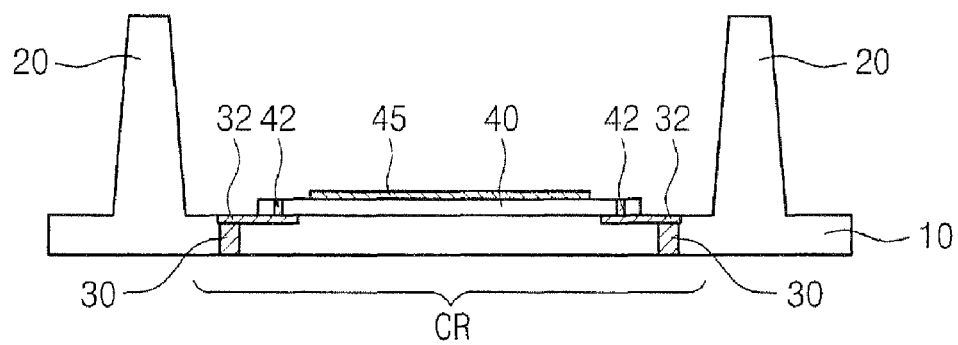
FIGS. 11 and 12 are cross-sectional views illustrating a method of fabricating a camera module according to another embodiment of the present invention.
Figure 12:
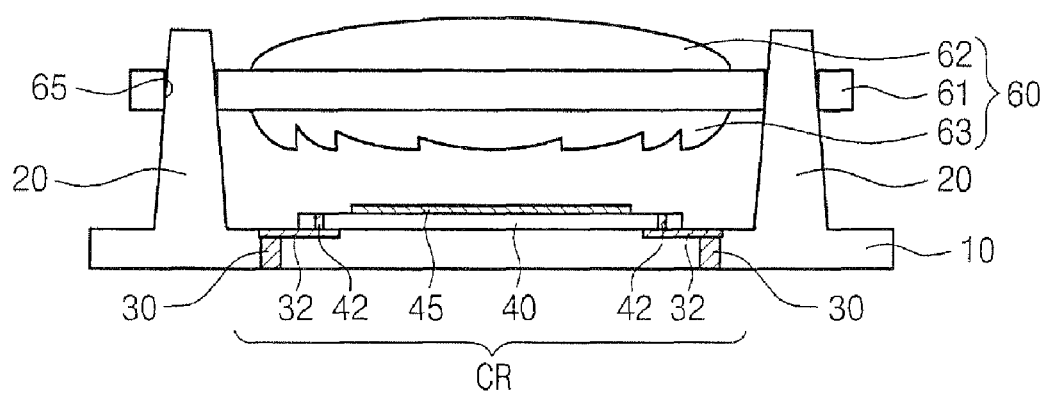

FIGS. 11 and 12 are cross-sectional views illustrating a method of fabricating a camera module according to another embodiment of the present invention. The current embodiment is generally similar to the foregoing embodiments except for a method of connecting an image sensor chip 40 with through plugs 30. Thus, a description of the same technical features as in the foregoing embodiments will be omitted here for brevity.

Referring to FIGS. 11 and 12, after forming the through plugs 30, redistribution structures 32, which are connected to the through plugs 30, are formed. In this case, the redistribution structures 32 extend under the image sensor chip 40.

In the current embodiment, the image sensor chip 40 may further include through vias 42, which are electrically connected to the output pads and formed through the image sensor chip 40. The redistribution structures 32 are electrically connected to the through vias 42, respectively. As a result, the image sensor chip 40 is connected to the through plugs 30 by the through vias 42 and the redistribution structures 32.

In another embodiment of the present invention, the through vias 42 may be directly connected to the through plugs 30 without using the redistribution structures 32. In this case, the through plugs 30 are formed under the image sensor chip 40.

Figure 13:
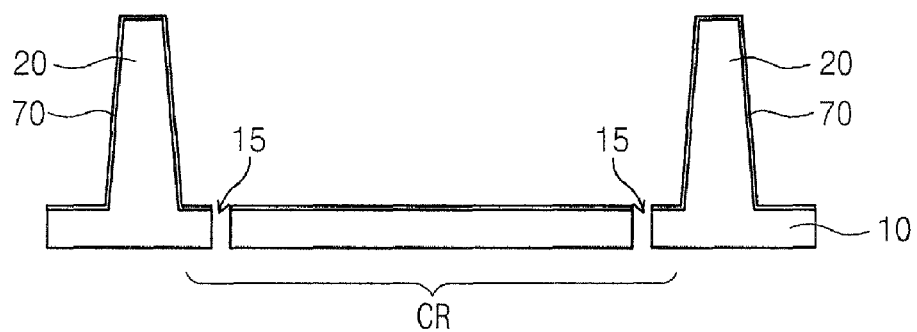
FIGS. 13 and 14 are cross-sectional views illustrating a method of fabricating a camera module according to yet another embodiment of the present invention.
Figure 14:
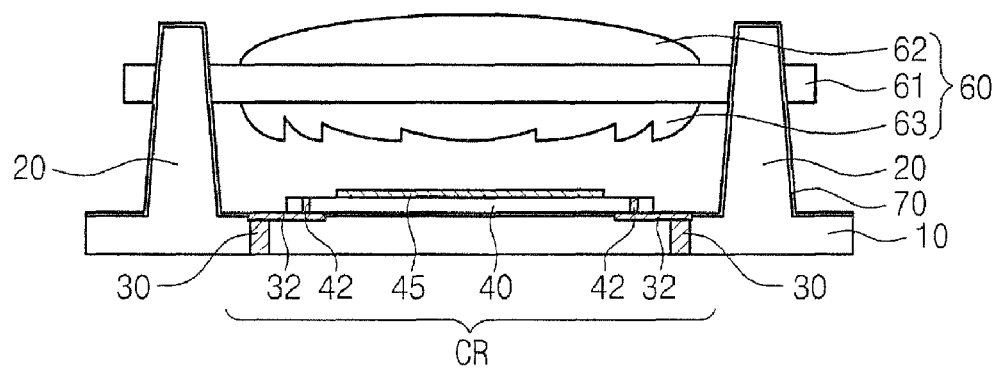

FIGS. 13 and 14 are cross-sectional views illustrating a method of fabricating a camera module according to yet another embodiment of the present invention. The current embodiment is generally similar to the foregoing embodiments except that an adhesive layer is added. Thus, a description of the same technical characteristics as in the foregoing embodiments will be omitted here for brevity.

Referring to FIG. 13, an adhesive layer 70 is coated on a substrate 10 having lower connection portions 20. In an embodiment of the present invention, the adhesive layer 70 may comprise a polymeric adhesive. Thereafter, the adhesive layer 70 and the substrate 10 are patterned to form through holes 15.

Referring to FIG. 14, a lens structure 60 is fixed into lower connection portions 20 of the substrate 10 using the adhesive layer 70. After inserting the lens structure 60 into the lower connection portions 20 coated with the adhesive layer 70, the resultant structure may be annealed at a predetermined temperature. The annealing process may be conducted at temperatures below the temperature at which the lens structure 60 or a micro-lens structure 45 will be damaged or deformed. Therefore, the adhesive layer 70 may be formed of a material that can be cured under the foregoing temperature conditions.

In another embodiment of the present invention, the adhesive layer 70 may be used to adhere the image sensor chip 70 to the substrate 10. In this case, only a chip region CR may be locally heated and the image sensor chip 40 may be adhered to the adhesive layer 70 of the chip region CR. In a modified embodiment of the present invention, the adhesive layer 70 may have a reversible adhesive property. In this case, a method of globally heating the adhesive layer 70 may be employed to adhere the image sensor chip 40 to the substrate 10.

Figure 15:
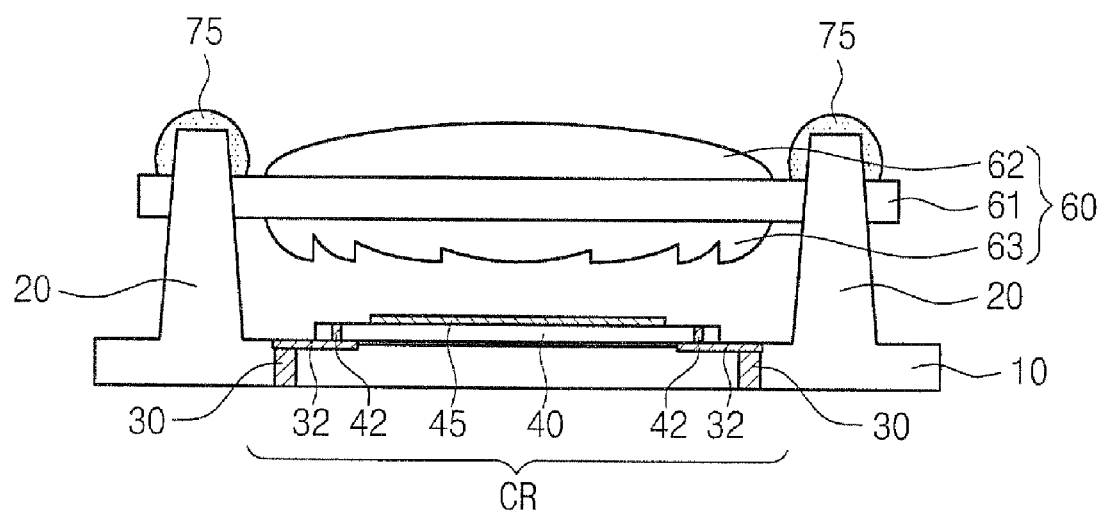
FIG. 15 is a cross-sectional view illustrating a method of fabricating a camera module according to still another embodiment of the present invention.

FIG. 15 is a cross-sectional view illustrating a method of fabricating a camera module according to still another embodiment of the present invention. The current embodiment is generally similar to the embodiments described with reference to FIGS. 13 and 14 except for a method of forming an adhesive layer and the position of the adhesive layer. Thus, a description of the same technical characteristics as in the foregoing embodiments will be omitted here for brevity.

Referring to FIG. 15, after inserting a lens structure 60 into lower connection portions 20 of a substrate 10, adhesive patterns 75 are formed on the lower connection portions 20 to fix the lower connection portions 20 and upper connection portions 65. The formation of the adhesive patterns 75 may be performed using a solder ball jetting technique or a screen printing technique. In this case, the lower connection portions 20 and the upper connection portions 65 can be fixed without using a thermal process. Thus, a thermal budget caused by a conventional bonding process and the thermal damage of the lens structure 60 or a micro-lens structure 45 can be prevented.

According to the embodiments of the present invention, a substrate having an image sensor chip is mechanically combined with a lens structure. Thus, a conventional thermal process is not required to combine the substrate with the lens structure. As a result, the damage of the lens structure and the image sensor chip due to a thermal process can be avoided. Also, since it is unnecessary to separately fabricate components, such as barrels and lenses, the entire fabrication process can be simplified and the fabrication costs can be reduced.

Furthermore, since a dicing process is performed along a scribe lane region to divide the substrate into the camera modules, technical problems, such as chipping and cracks can be minimized.

According to an aspect of the present invention, there is provided a method of fabricating a camera module in which a lens structure is mechanically combined with a substrate. The method includes preparing the lens structure having upper connection portions. Lower connection portions are formed in a predetermined region of the substrate. The lower connection portions define a chip region and fit in the upper connection portions, respectively. An image sensor chip is located on the bottom surface of the chip region. The lens structure is adhered to the substrate using the upper and lower connection portions.

In this case, the lower connection portion may have a pillar shape that protrudes from the substrate around the chip region. Also, the upper connection portions may have a groove shape arranged in a plane position corresponding to the lower connection portions so that the lower connection portions can be inserted into the upper connection portions.

In an embodiment of the present invention, the formation of the lower connection portions may include preparing the substrate and recessing the top surface of the substrate in the chip region by patterning the substrate. In this case, the patterning of the substrate may be performed such that the sectional area of the lower connection portions become smaller near the top of the lower connection portions than near the bottom thereof.

In an embodiment of the present invention, the substrate may be formed of at least one selected from the group consisting of silicon, glass, a plastic, and a metal.

The method according to the present invention may further include forming through plugs through the substrate in an outer portion of the chip region and electrically connecting the image sensor chip to the through plugs. In an embodiment of the present invention, the image sensor chip may be electrically connected to the through plugs using bonding wires. In another embodiment of the present invention, the method according to the present invention may further include forming redistribution structures extending from the through plugs under the image sensor chip after forming the through plugs. In this case, the image sensor chip may include through vias formed through the image sensor chip, and the through vias may be electrically connected to the redistribution structures, respectively.

In an embodiment of the present invention, the adhesion of the lens structure to the substrate may include fixing the lower and upper connection portions by forming a predetermined adhesive. In this case, the formation of the adhesive may include forming a polymeric adhesive layer on the substrate having the lower connection portions. Here, the polymeric adhesive layer may be used to adhere the image sensor chip to the substrate.

In another embodiment of the present invention, after adhering the lens structure to the substrate, the method according to the present invention may further include forming adhesion patterns on portions of the upper connection portions into which the lower connection portions are inserted, using one of a solder ball jetting technique and a screen printing technique.

According to another aspect of the present invention, there is provided a camera module including a lens structure and a substrate that are mechanically combined with each other. The camera module includes the substrate including lower connection portions defining a chip region. An image sensor chip is disposed on the chip region. The lens structure has upper connection portions in which the lower connection portions fit.

The lower connection portion may have a pillar shape that protrudes from the substrate around the chip region. The upper connection portions may have a groove shape arranged in a plane position corresponding to the lower connection portions so that the lower connection portions can be inserted into the upper connection portions. Also, the cross-sectional area of the lower connection portions may become smaller near the top of the lower connection portions than near the bottom thereof.

According to the present invention, the substrate may be formed of at least one of silicon, glass, a plastic, and a metal.

According to some embodiments, a method comprises: forming a plurality of lower connection portions on a substrate, the lower connection portions defining a chip region, wherein the lower connection portions have tapered sidewalls; forming through vias in the substrate; filling the through vias to form through plugs; mounting an image sensor chip on the chip region; electrically connecting the image sensor chip to the through plugs; forming upper connection portions in a lens structure, the lens structure comprising one or more convex lenses; and mounting the lens structure on the substrate such that the lower connection portions engage the upper connection portions, thereby spacing the lenses apart from the image sensor chip by a pre-determined distance.

Filling the through holes may include: forming an insulating layer on the sidewalls of the through vias; and filling the through holes with a conductive material. Mounting the image sensor chip may include: forming an adhesive on the chip region; and adhering the image sensor chip to the chip region using the adhesive. Electrically connecting the image sensor chip may comprise wire-bonding the image sensor chip to the through plugs. Alternatively, electrically connecting the image sensor chip may comprise: forming through-chip vias in the image sensor chip; and forming redistribution patterns on the chip region, the redistribution patterns electrically connecting the through-chip vias to the though plugs.

According to some embodiments, the method may further comprise forming an adhesive layer on the substrate before mounting the lens structure on the substrate. According to other embodiments, the method may further include forming adhesive patterns on the lower connection portions and the upper connection portions after mounting the lens structure on the substrate.

According to some embodiments, the method includes dicing the substrate so as to form a plurality of image sensor modules.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a camera module, comprising:
preparing a lens structure having upper connection portions and lenses;
forming lower connection portions in a predetermined region of a substrate, the lower connection portions defining a chip region and configured to engage the upper connection portions;
mounting an image sensor chip in the chip region; and
adhering the lens structure to the substrate using the upper and lower connection portions;
wherein the lens structure further comprises a transparent wafer, wherein the upper connection portions are formed in the transparent wafer as grooves configured to receive the lower connection portions, and wherein the lenses are formed on opposite sides of the transparent wafer.

2. The method according to claim 1, wherein the lower connection portions have a pillar shape that protrudes from the substrate around the chip region,
and the upper connection portions have a groove shape formed in a plane position corresponding to the lower connection portions so that the lower connection portions are inserted into the upper connection portions.

3. The method according to claim 1, wherein forming the lower connection portions comprises:
preparing the substrate; and
recessing the top surface of the substrate in the chip region by patterning the substrate,
wherein patterning the substrate is performed such that the cross-sectional area of the lower connection portions become smaller near the top of the lower connection portions than near the bottom thereof.

4. The method according to claim 1, wherein the substrate is formed of at least one selected from the group consisting of silicon, glass, a plastic, and a metal.

5. The method according to claim 1, further comprising:
forming through plugs through the substrate in an outer portion of the chip region; and
electrically connecting the image sensor chip to the through plugs.

6. The method according to claim 5, wherein the image sensor chip is electrically connected to the through plugs using bonding wires.

7. The method according to claim 5, further comprising forming redistribution structures extending from the through plugs toward a region under the image sensor chip, after forming the through plugs,
wherein the image sensor chip includes through vias formed through the image sensor chip,
and the through vias are electrically connected to the redistribution structures.

8. The method according to claim 1, wherein adhering the lens structure to the substrate comprises fixing the lower and upper connection portions by forming an adhesive on the lower connection portions.

9. The method according to claim 8, wherein forming the adhesive comprises forming a polymeric adhesive layer on the substrate having the lower connection portions,
wherein the polymeric adhesive layer adheres the image sensor chip to the substrate.

10. The method according to claim 1, after adhering the lens structure to the substrate, further comprising forming adhesion patterns on portions of the upper connection portions into which the lower connection portions are inserted, using one of a solder ball jetting technique and a screen printing technique.

11. A camera module comprising:
a substrate including lower connection portions defining a chip region;
an image sensor chip disposed on the chip region; and
a lens structure having upper connection portions and lenses, wherein the lower connection portions are engaged in the upper connection portions;
wherein the lens structure further comprises a transparent wafer, wherein the upper connection portions are formed in the transparent wafer as grooves configured to receive the lower connection portions, and wherein the lenses are formed on opposite sides of the transparent wafer.

12. The module according to claim 11, wherein the lower connection portions have a pillar shape that protrudes from the substrate around the chip region,
and the upper connection portions have a groove shape formed in a plane position corresponding to the lower connection portions so that the lower connection portions are inserted into the upper connection portions.

13. The module according to claim 11, wherein the cross-sectional area of the lower connection portion becomes smaller near the top of the lower connection portion than near the bottom thereof.

14. The module according to claim 11, wherein the substrate is formed of at least one of silicon, glass, a plastic, and a metal.

15. The module according to claim 11, further comprising:
through plugs formed through the substrate in an outer portion of the chip region; and
connection units for electrically connecting the through plugs to the image sensor chip.

16. The module according to claim 15, wherein the connection units are bonding wires.

17. The module according to claim 15, wherein the connection units comprise:
through vias formed through the image sensor chip; and
redistribution structures extending from the through plugs toward a region under the image sensor chip and connected to the through vias.

18. The module according to claim 11, further comprising an adhesive interposed between the lower connection portions and the upper connection portions.

19. The module according to claim 11, further comprising an adhesive formed on a portion of the upper connection portions into which the lower connection portions are inserted.

20. A method, comprising:
forming a plurality of lower connection portions on a substrate, the lower connection portions defining a chip region, wherein the lower connection portions have tapered sidewalls;
forming through holes in the substrate;
filling the through holes to form through plugs;
mounting an image sensor chip on the chip region;
electrically connecting the image sensor chip to the through plugs;
forming upper connection portions in a lens structure, the lens structure comprising one or more convex lenses; and
mounting the lens structure on the substrate such that the lower connection portions engage the upper connection portions, thereby spacing the lenses apart from the image sensor chip by a pre-determined distance;
wherein the lens structure further comprises a transparent wafer, wherein the upper connection portions are formed in the transparent wafer as grooves configured to receive the lower connection portions, and wherein the lenses are formed on opposite sides of the transparent wafer.

21. The method of claim 20, wherein filling the through holes comprises:
forming an insulating layer on the sidewalls of the through holes; and
filling the through holes with a conductive material.

22. The method of claim 20, wherein electrically connecting the image sensor chip comprises wire-bonding the image sensor chip to the through plugs.

23. The method of claim 20, wherein electrically connecting the image sensor chip comprises:
forming through-chip vias in the image sensor chip; and
forming redistribution patterns on the chip region, the redistribution patterns electrically connecting the through-chip vias to the through plugs.

24. The method of claim 20, further comprising forming adhesive patterns on the lower connection portions and the upper connection portions after mounting the lens structure on the substrate.

25. The method of claim 20, further comprising dicing the substrate so as to form a plurality of image sensor modules.

* * * * *